United States Patent [19]

Ovens

[11] Patent Number: 5,073,728
[45] Date of Patent: Dec. 17, 1991

[54] ACTIVE LOAD FOR ECL TYPE OUTPUTS

[75] Inventor: Kevin M. Ovens, Garland, Tex.

[73] Assignee: Texas Instruments Incorporated, Dallas, Tex.

[21] Appl. No.: 609,037

[22] Filed: Nov. 5, 1990

Related U.S. Application Data

[63] Continuation of Ser. No. 302,063, Jan. 24, 1989, abandoned, which is a continuation of Ser. No. 73,665, Jul. 15, 1987, abandoned.

[51] Int. Cl.$^5$ .................... H03K 19/086; H03K 5/153
[52] U.S. Cl. .................................. 307/455; 307/458; 307/467; 307/362
[58] Field of Search ............... 307/455, 458, 467, 263, 307/362, 272.1, 443

[56] References Cited

U.S. PATENT DOCUMENTS

| | | | |
|---|---|---|---|
| 3,134,032 | 5/1964 | Mann | 307/290 |
| 4,626,709 | 12/1986 | Mazumder et al. | 307/455 |
| 4,689,500 | 8/1987 | Gray et al. | 307/362 |
| 4,754,171 | 5/1988 | Dasai et al. | 307/455 |

FOREIGN PATENT DOCUMENTS

| | | | |
|---|---|---|---|
| 0072314 | 4/1985 | Japan | 307/362 |
| 1067590 | 1/1984 | U.S.S.R. | 307/272.1 |

*Primary Examiner*—Stanley D. Miller
*Assistant Examiner*—Margaret R. Wambach
*Attorney, Agent, or Firm*—B. Peter Barndt; James T. Comfort; Melvin Sharp

[57] ABSTRACT

An active pull down circuit for a logic circuit, having a true and a complement output, a pull down transistor coupled to one of the true and complement outputs, a bias element for biasing the pull down transistor on, and a charge coupling element coupled between the other of the true and complement outputs and a base of the pull down transistor for coupling charge from the other output to the pull down transistor to turn on the latter harder when the other output goes low.

14 Claims, 1 Drawing Sheet

ACTIVE LOAD FOR ECL TYPE OUTPUTS

This application is a continuation, of application Ser. No. 07/302,063, filed Jan. 24, 1989 which is a continuation of Ser. No. 07,073,665 filed Jul. 15, 1987, both now abandoned.

BACKGROUND OF THE INVENTION

The present invention relates to an active load for use with emitter coupled logic type output circuits.

Load circuits currently used in emitter coupled logic outputs use either ordinary resistors to the negative supply voltage line (i.e. $V_{EE}$) or a transistor in series with a resistor coupled to the emitter of both the true and complement emitter follower output transistors. Typically such loads add 20% to 30% to the power of most emitter coupled logic circuits. The loading of such circuits can be reduced by half by using a differential pair with a single transistor coupled to $V_{EE}$ with each output transistor in the collector circuit of one of the differential transistors. However, it is still highly desirable to further reduce the power consumption of such load circuits.

A more complex pull down or load circuit for ECL circuits is disclosed in U.S. Pat. No. 4,559,458 issued on Dec. 17, 1985 to Bing-Fong Ma. The Ma patent uses 13 components to load only one output. As far as power consumption is concerned, Ma connects 5 components to ground for one output. Each time a component connects to ground the D.C. power increases. The minimum voltage required to operate the Ma circuit is 3.7 volts. It is desirable for ECL circuits to be able to operate down to voltages less than 2 volts.

Accordingly, it is an object of the invention to provide an active load circuit for emitter coupled logic circuits which adds relatively little power to the emitter coupled logic circuit.

SUMMARY OF THE INVENTION

In one aspect of the invention there is provided a load circuit for an emitter coupled logic circuit having complementary emitter follower output transistors which includes a true and a complement load transistor coupled from an emitter of the true and complement output transistor, respectively, to a negative voltage supply line, a biasing element coupled from a base of each of the true and complement transistors to the negative voltage supply line and an a.c. coupling element coupled from an output of the true and complement output transistors to a base of the complement and true load transistors, respectively.

Preferably, the biasing element may be a diode connected transistor so that each of the true and complement load transistors is normally biased on but with a current close to cut off. When one of the output transistors turns on driving that output high, charge is coupled to the pull down transistor driving it on harder and pulling down the emitter of the other output transistor. The low quiescent currents of the load transistors ensures that the d.c. power dissipation is low.

Advantageously, the a.c. coupling element may be a capacitor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
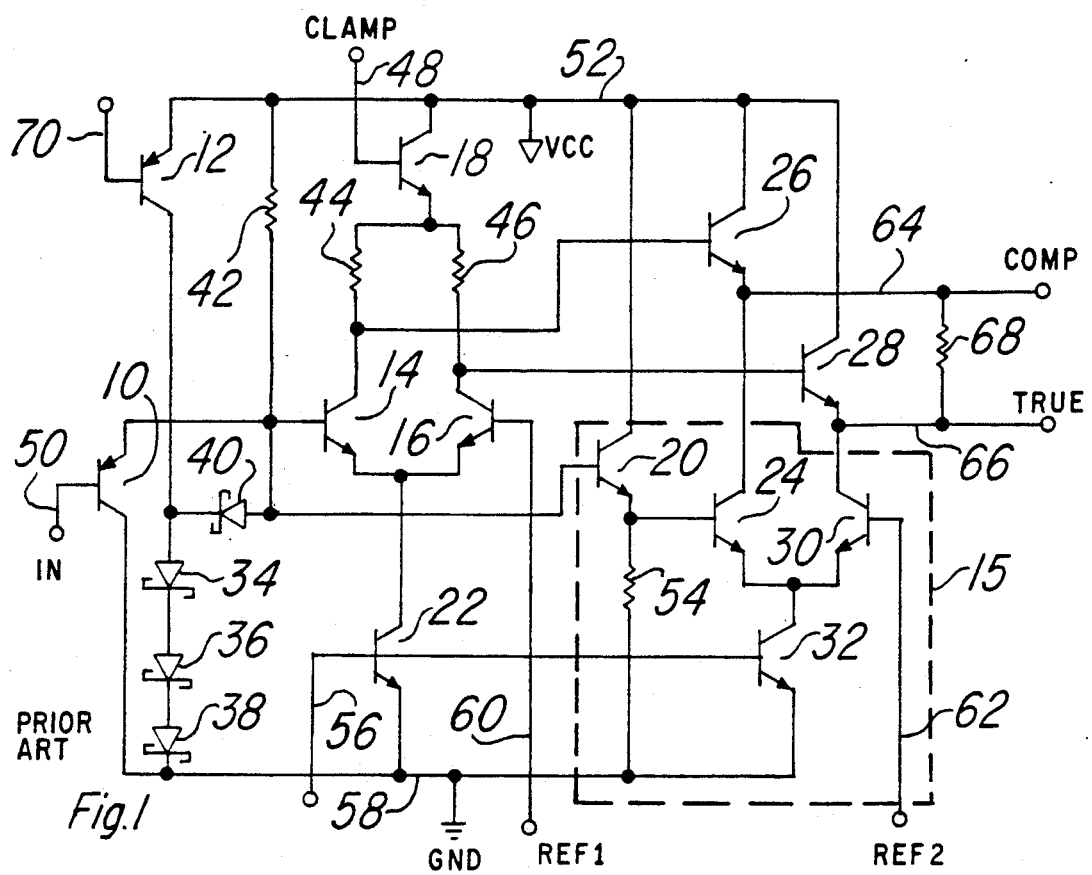
FIG. 1 is an electrical schematic diagram of a conventional active load circuit as implemented in an ECL circuit.

With reference to FIG. 1, a modified ECL true/complement buffer in which an input on line 50 drives the base of a PNP transistor 10 whose emitter pulls current from a bias resistor 42. The current through resistor 42 provides base current to transistors 14 and 20 as well as to diodes 40, 34, 36, and 38. Transistor 12 whose base 70 is driven externally by a control signal provides current to diodes 34, 36, and 38 when base 70 is driven low. Transistor 16 of differential pair 14 and 16 has its base connected by line 60 to a reference voltage. Resistors 44 and 46 provide the collector loads to transistors 14 and 16, respectively, and are both connected to the emitter of a clamp transistor 18 whose collector is connected to high voltage line 52 and whose base is connected by line 48 to an externally supplied clamp voltage.

The emitters of transistors 14 and 16 are connected in common to the collector of transistor 22 whose emitter, in turn, is connected to ground line 58. The base of transistor 22 as well as that of another current source transistor 32 is driven by line 56 from an external pin. The output taken from the collector of transistor 16 drives the base of an emitter follower true output transistor 28 while the output taken from the collector of transistor 14 drives the base of an emitter follower complement output transistor 26. The true output on line 66 is taken from the emitter of true output transistor 28 while the complement output on line 64 is taken from the emitter of complement output transistor 26.

An output transistor load circuit 15 consists of transistors 20, 24, 30 and 32. Transistors 24 and 30 have their emitters connected in common to the collector of current source transistor 32 whose emitter connects to ground line 58. The base of transistor 30 is connected by line 62 to a second reference voltage source. The emitter of emitter follower transistor 20 drives the base of transistor 24. Resistor 54 coupled between ground line 58 and the emitter of transistor 20 forms the load transistor of transistor 20.

In operation assume that line 70 is low and line 48 high so that transistor 12 supplies bias current to emitter string 34, 36, and 38 thereby setting an upper limit on the voltage swing allowed on the base of transistor 14 to four diode forward voltage drops. If the voltage on line 50 drops so that current is drawn out of the base of transistor 10, transistor 14 is turned off as is transistor 20. Diode 40 tends to turn off as the voltage on the emitter of transistor 10 drops. Correspondingly, transistor 16 is turned on so that the base of transistor 26 goes high while that of transistor 28 goes low. Thus, complement line 64 goes high while true line 66 goes low. At the same time transistors 20 and 24 tend to turn off and transistor 30 turns on pulling down the voltage on line 66. The amount of pull down current required to draw down the output voltage of the output line dropping sets a lower limit to the bias current through transistor 32 required. While differentially connecting the pull down transistors 24 and 30 cuts by half the quiescent current drawn by these transistors overall, such current still represents a relatively large proportion of the power dissipation of the overall circuit.

Figure 2:
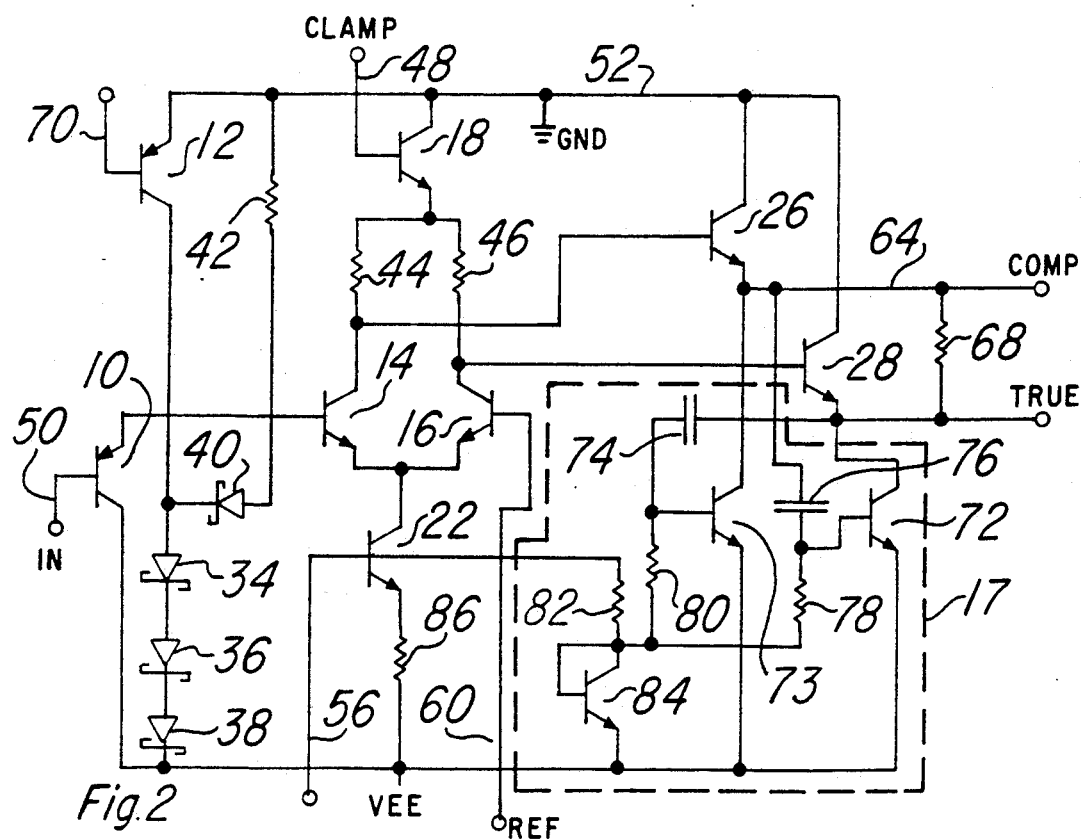
FIG. 2 is an electrical schematic diagram of an active load circuit in accordance with a preferred embodiment of the invention.

An improved load circuit 17 is shown in FIG. 2, in which like components to those in FIG. 1 are labeled with the same reference numbers. The circuit of FIG. 2 is identical to that of FIG. 1 except for the load circuit 17 in which transistors 72 and 73 couple to true and complement output lines 66 and 64, respectively. The base bias of each of transistors 72 and 73 is set by a diode connected transistor 84 coupled to each base through isolating resistors 78 and 80. Bias current to diode 84 and to the base of transistors 72 and 73 is provided by current through resistor 82 from line 56. Coupling capacitors 74 and 76 couple charge from the true and complement outputs 66 and 64, respectively, to the base of transistors 73 and 72, respectively.

Assuming as before that the complement output on line 64 goes high and the true output on line 66 goes low, charge from line 64 is coupled by capacitor 76 to the base of pull down transistor 72 driving the latter on harder to enhance the pull down of true line 66. In a typical application in which the circuit is incorporated onto a semiconductor integrated circuit chip, the D.C. current level through transistor 22 is 400 microamperes, the quiescent current through each of transistors 72 and 73 is about 40 microamperes. This is in the range of 1/10 to 1/100 of the current through the associated logic circuit. The switching current through transistor 72 or 73 could be set at 4 milliamperes, resulting in a faster circuit than that of FIG. 1 at 52% of the power. In FIG. 1, the current through transistor 32 would be about the same as that through transistor 22 or about 400 microamperes. If the switching current through transistor 72 were about 4 milliamperes then the power dissipation of the circuit of FIG. 1 would be 4.16 milliwatts while that through the circuit of FIG. 2 would be 2.18 milliwatts.

Another important advantage of the circuit of FIG. 2 is that it can be used with a supply voltage as low as 1.6 volts whereas that of FIG. 1 is constrained to operate with voltages above about 2.6 volts. In the circuit of FIG. 2, the recovery time is set by the value of 3 to 5 times the RC of resistor-capacitor combinations 80, 74 and 78, 76. The time constant of the isolating resistors and capacitors is selected to be in the range of 0.5 to 2.0 nanoseconds.

Clearly, the pull down circuit of FIG. 2 can be used internally with other types of logic circuits and when so used contributes significantly to the power saving for the chip as a whole.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An active load circuit for a logic output circuit, which has a true output, a complementary output, and external reference line and a reference supply voltage line, said active load circuit comprising:
    a first transistor having a collector connected to said true output, an emitter connected to said reference supply voltage line, and a base;
    a second transistor having a collector connected to said complementary output, an emitter connected to said reference supply voltage line, and a base;
    a bias circuit having an output coupled to said bases of said first and second transistors and said external reference line and having an input connected to said reference supply voltage line, said bias circuit supplying bias current to said first and second transistors;
    a first charge coupling element connected between and for coupling charge between said base of said first transistor and said complementary output lead; and
    a second charge coupling element connected between and for coupling charge between said base of said second transistor and said true output lead.

2. The active load circuit of claim 1 in which said charge coupling elements are capacitors.

3. The active load circuit of claim 1 in which said bias circuit includes a current source supplying current and connected between said first and second leads and a diode connected transistor connected in said second lead.

4. The active load circuit of claim 1 in which said bias circuit includes a first resistor connecting said base of said first transistor to said first lead and a second resistor connecting said base of said second transistor to said first lead.

5. The active load circuit of claim 4 in which said charge coupling elements are capacitors and said resistors and capacitors being selected to furnish a time constant in the range of 0.5 to 2.0 nanoseconds.

6. The active load circuit of claim 1 in which said logic output circuit passes a quiescent current and said active load circuit passes a quiescent current through said first and second transistors and said bias circuit in the range of 1/10 to 1/100 of the logic output circuit quiescent current.

7. The active load circuit of claim 1 in which said logic output circuit includes a pair of differential transistors each having emitters connected together and coupled to said reference supply voltage line by a current source, said pair of differential transistors each having collectors, said logic output circuit further including a true and a complementary output transistor respectively connected between a collector of said pair of differential transistors and said true and complementary output leads.

8. The active load circuit of claim 1 in which said reference supply voltage line is a negative supply voltage line.

9. The active load circuit of claim 1 in which said bias circuit includes a diode connected transistor selected to supply bias current to said first and second transistors that biases said first and second transistors on but close to cut off.

10. An active load circuit for a logic output circuit, which has at least a true output lead, a complementary output lead, an external reference line and a reference supply voltage line, said active load circuit comprising:
    at least one load transistor having a collector connected to one of said output leads, an emitter connected to said reference supply line, and a base;
    a bias circuit having an output connected to said at least one load transistor and to said external reference line, and an input connected to said reference supply voltage line, said bias circuit supplying bias current to said at least one load transistor sufficient to bias on said at least one load transistor but with a bias current close to cut off; and a capacitor connected between the base of said at least one load transistor and the other of said output leads.

11. The active load circuit of claim 10 in which there are two load transistors, each having an emitter connected to said reference supply voltage line.

12. The active load circuit of claim 10 in which said bias circuit includes a current source supplying current, a diode connected transistor connected between said current source and said reference supply voltage line, and an isolating resistor connected between said current source and said base of said at least one load transistor.

13. The active load circuit of claim 10 in which said reference supply voltage line is a negative supply voltage line.

14. The active load circuit of claim 10 in which said logic output circuit includes a pair of differential transistors each having emitters connected together and coupled to said reference supply voltage line by a current source, said pair of differential transistors each having collectors, said logic output circuit further including a true and a complementary output transistor respectively connected between a collector of said pair of differential transistors and said true and complementary output leads.

* * * * *